(12) United States Patent
Bollenbeck et al.

(10) Patent No.: US 9,581,669 B2
(45) Date of Patent: Feb. 28, 2017

(54) SYSTEM AND METHODS FOR PROVIDING MAGNETIC RESONANCE IMAGING DATA FOR AN IMAGE RECONSTRUCTION

(71) Applicants: Jan Bollenbeck, Eggolsheim (DE); Jörg Hüttner, München (DE); Klaus Pistor, Dietramszell OT. Linden (DE); Stefan Schwarzer, Taufkirchen (DE); Markus Vester, Nürnberg (DE)

(72) Inventors: Jan Bollenbeck, Eggolsheim (DE); Jörg Hüttner, München (DE); Klaus Pistor, Dietramszell OT. Linden (DE); Stefan Schwarzer, Taufkirchen (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 516 days.

(21) Appl. No.: 14/204,007

(22) Filed: Mar. 11, 2014

(65) Prior Publication Data

US 2014/0266190 A1  Sep. 18, 2014

(30) Foreign Application Priority Data

Mar. 18, 2013  (DE) .......................... 10 2013 204 705

(51) Int. Cl.
*G01R 33/56* (2006.01)
*G01R 33/36* (2006.01)

(52) U.S. Cl.
CPC .......... *G01R 33/56* (2013.01); *G01R 33/3692* (2013.01)

(58) Field of Classification Search
CPC .............................. G01R 33/3692; G01R 33/56
See application file for complete search history.

(56) References Cited

U.S. PATENT DOCUMENTS 8,598,874 B2 * 12/2013 Saes .................... G01R 33/3614
  324/307
8,704,522 B2 * 4/2014 Akita .................. G01R 33/3692
  324/318

(Continued)

FOREIGN PATENT DOCUMENTS

DE  102011006497 A1  10/2012
DE  102011076918 A1  12/2012

(Continued)

OTHER PUBLICATIONS

German Search Report dated Nov. 6, 2013 for corresponding DE 102013204705.3 with English translation.

*Primary Examiner* — Gregory H Curran
(74) *Attorney, Agent, or Firm* — Lempia Summerfield Katz LLC

(57) ABSTRACT

The embodiments relate to an image reconstruction to be carried out on a base unit of a MRI system, where data is formed by reception signals obtained by a local coil unit. Provisions are made for an alternating magnetic field, modulated in accordance with a reference clock, the alternating magnetic field to be used by the local coil unit for obtaining electric energy for supplying local electronics of the local coil unit and the reference clock to be retrieved from the received alternating magnetic field by the local electronics, a radio signal containing MRI information representing the reception signals and clock information representing the retrieved reference clock to be produced by the local electronics and transmitted to the base unit, and the received radio signal to be processed by the base unit such that the data and the clock information are retrieved therefrom and provided for the image reconstruction.

19 Claims, 2 Drawing Sheets

(56) References Cited

U.S. PATENT DOCUMENTS

| | | | |
|---|---|---|---|
| 8,866,480 B2 * | 10/2014 | Waffenschmidt | G01R 33/283 324/318 |
| 2012/0249135 A1 | 10/2012 | Albsmeier et al. | |
| 2012/0313645 A1 | 12/2012 | Biber et al. | |
| 2013/0021035 A1 | 1/2013 | Kundner et al. | |
| 2013/0200894 A1 | 8/2013 | Albsmeier et al. | |

FOREIGN PATENT DOCUMENTS

| | | |
|---|---|---|
| DE | 102011079564 A1 | 1/2013 |
| DE | 102011080141 A1 | 1/2013 |
| WO | WO2009153727 A2 | 12/2009 |

* cited by examiner

SYSTEM AND METHODS FOR PROVIDING MAGNETIC RESONANCE IMAGING DATA FOR AN IMAGE RECONSTRUCTION

CROSS-REFERENCE TO RELATED APPLICATIONS

This application claims the benefit of DE 10 2013 204 705.3, filed on Mar. 18, 2013, which is hereby incorporated by reference in its entirety.

TECHNICAL FIELD

The present embodiments relate, in general, to the field of magnetic resonance imaging (MRI) and, in particular, to a method for providing MRI data for an image reconstruction to be carried out by an evaluation apparatus on an MRI base unit of an MRI system.

BACKGROUND

By way of example, a method and system for providing MRI data are described in DE 10 2011 079 564 A1.

In DE 10 2011 079 564 A1, MRI reception signals are amplified in the region of the local coil unit and then transmitted by wires to the MRI base unit or the evaluation apparatus found there. Within the scope of DE 10 2011 079 564 A1, it is also mentioned that MRI reception signals may be transmitted to the evaluation apparatus wirelessly, but the practical embodiment of such a radio transmission is not discussed in any more detail.

SUMMARY AND DESCRIPTION

The scope of the present invention is defined solely by the appended claims and is not affected to any degree by the statements within this summary. The present embodiments may obviate one or more of the drawbacks or limitations in the related art.

Here, MRI data is formed by MRI reception signals obtained by an MRI local coil unit of the system.

"MRI system" may denote the totality of the components employed for carrying out an MRI examination, with the MRI system of the type of interest here including an "MRI base unit" and (at least) one "MRI local coil unit."

The "MRI base unit" may denote that part of the system that, in particular, comprises the components for generating the magnetic field (including the alternating magnetic fields in the radiofrequency range for resonant excitation of the nuclear spins) required for the MRI and an evaluation apparatus employed within the scope of the image reconstruction.

By contrast, the term "local coil unit" denotes a reception unit, arranged more or less directly on the object or patient to be examined, for registering the "nuclear spin responses" (of the nuclear spins excited by the radiofrequency magnetic fields) arising during the MRI examination. The local coil unit comprises at least one local coil arrangement, e.g., one or more so-called local coils ("loops"), and optionally also one or more preamplifiers for amplifying the nuclear spin responses detected by the local coils by induction.

The use of a local coil unit in MRI systems is wide spread and has the advantage of an improved signal-to-noise ratio of the MRI reception signals obtained thereby.

The MRI reception signals obtained by the MRI local coil unit (e.g., on the local side), form the basis for the base unit-side image reconstruction (e.g., image reconstruction to be carried out on the MRI base unit). To this end, it is necessary to transmit the MRI reception signals or the MRI information contained therein, which is/are obtained on the local side, to the MRI base unit of the relevant MRI system.

It is an object of the present embodiments to realize a wireless transmission of the MRI information arising on the local side to the MRI base unit during a provision of MRI data as mentioned at the outset, wherein cables between the MRI base unit and MRI local coil unit are to be avoided and a high-quality image reconstruction is to be made possible.

In an embodiment, one object is achieved by virtue of the fact that (a) an alternating magnetic field, modulated in accordance with a reference clock, is produced by the MRI base unit, (b) the alternating magnetic field is used by the MRI local coil unit for obtaining electric energy for supplying local electronics of the MRI local coil unit and the reference clock is retrieved from the received alternating magnetic field by the local electronics, (c) a radio signal containing MRI information representing the MRI reception signals and clock information representing the retrieved reference clock is produced by the local electronics and transmitted to the MRI base unit, and (d) the received radio signal is processed by the MRI base unit in such a way that the MRI data and the clock information are retrieved therefrom and provided to the evaluation apparatus for the image reconstruction.

A first basic concept therefore consists of transmitting both energy and a reference clock to the MRI local coil unit proceeding from the MRI base unit by an alternating magnetic field generated there (act a) in order, on the local side, to use the energy and reference clock (act b) to transmit MRI information by radio signal back to the MRI base unit (act c) and subsequently to provide at the MRI base unit the MRI data for the image reconstruction by processing the received radio signal (act d).

An actual realization of the basic concept initially fails due to a slightly subtle, but in practice, serious problem relating to the transmission of a reference clock provided in act a).

Before the subsequent explanation of the problem, it must be stated that in known MRI systems the local-side provision of a "precise reference clock", (with exact synchronization to the base unit-side reference clock such as used for MRI magnetic field production), is of importance. This is due to the fact that the MRI image reconstruction may not be undertaken exclusively with the MRI data arising on the local side as such but moreover also requires a "temporal classification" of the MRI information in respect of the time-varying MRI magnetic fields, which occur as a matter of principle during MRI examinations, that is as exact as possible.

The inherent practical problem in act a) consists of the fact that relatively small movements of the MRI local coil unit in relation to the MRI base unit when carrying out an MRI examination already lead to corresponding phase changes of the reference clock retrieved in act b).

In practice, such movements of the local coil unit, and hence of the local coil(s) contained therein, in particular may be caused by, for example, respiration of a patient to be examined or his movement on a patient couch that may be displaced in the MRI recording space.

A time-varying distance between the transmitter of the alternating field produced in act a) (MRI base unit) and the receiver of the alternating field (reception coil(s) in the local coil unit) causes a phase change or phase modulation in the reference clock received on the local side.

A time-varying angular orientation of the receiver in the recording space may also contribute to such a phase modulation, e.g., if the alternating field produced in act a) is provided as a rotating field.

In one embodiment, the modulated alternating magnetic field produced on the base unit-side is in fact a rotating magnetic field, for example a magnetic field that is substantially homogeneous in the region of a local coil unit but rotates with a constant angular velocity about a longitudinal axis of the recording space.

If the reference clock retrieved on the local side with uncontrollable phase modulation in act b) is then used in act c) to prepare the response signals of the excited nuclear spins (MRI reception signals) or the inherent MRI information contained therein, and to produce the radio signal to be transmitted to the stationary MRI base unit, the phase modulation may be transferred in a disadvantageous manner onto the MRI information, leading to corresponding interference in the MRI image reconstructed by the evaluation apparatus.

However, the problem is solved in an elegant manner by a special embodiment of acts c) and d). Before further measures will be explained in more detail below, numerical examples relating to the phase modulation caused by movements of the local coil unit are initially provided.

The following calculation relates in an exemplary manner to an MRI system with an MRI magnetic field strength of 3 tesla (T) and, accordingly, a Larmor frequency of 123.2 megahertz (MHz). Moreover, an exemplary assumption is made that in act a) the magnetic field produced for wireless energy supply and reference clock transmission is embodied as a rotating field rotating with a rotational frequency of 5 MHz.

The channel therefore formed by the 5 MHz rotating field, by which the reference clock is transmitted, decisively contains, in particular, the following two sources of error that may lead to a phase modulation of the reference clock retrieved in act b): (1) a rotation of the reception antenna (assumed to be about the axis of the magnetic field rotation) produces a run-time offset proportional to the angle of rotation; and (2) a change in distance between transmission and reception antenna generates a run-time offset proportional to the change in distance.

In one non-limiting example, a rotation of the local coil unit by 1 degree produces a run-time offset of $1°/360° \times 1/(5 \text{ MHz})=0.555$ ns or a phase offset of 123.2 MHz/5 MHz$\times 1°=24.64°$ at the Larmor frequency.

In another non-limiting example, a displacement of the local coil unit by 1 cm produces a run-time offset of at most $1 \text{ cm}/3 \times 10^8 \text{ m/s}=0.033$ ns, and therefore a phase offset of $360° \times 123.2 \text{ MHz} \times 0.033 \text{ ns}=1.46°$ at the Larmor frequency.

These non-limiting examples demonstrate that a rotation of the reception antenna, in particular, leads to large, non-negligible phase errors in the clock signal retrieved on the local side.

In known MRI systems with a wired transmission channel between MRI base unit and MRI local coil units, a problem of the undesired phase modulation in the transmission path from the base unit to the local coil unit does not occur. The further concept, namely to avoid potential interference in the image reconstruction due to the wireless transmission channel as per acts a) and b) now consists of, by acts c) and d), also employing the transmission channel, required in any case for transmitting the MRI information back from the local coil unit to the base unit, for a return transmission of the (retrieved) reference clock or clock information representing the reference clock to the stationary MRI base unit (act c)), in order thereby to enable the MRI base unit or the evaluation apparatus arranged on the base unit-side to take into account the phase modulation applied in the outward channel during the image reconstruction (act d)), in order thereby in turn to reduce or avoid otherwise potential interference.

It is understood that, where possible, no substantial undefined further phase error (for example by the movements of the local coil unit) may be induced during the return transmission of the reference clock to the base unit. However, as will still be explained below, a solution may be realized or provided in a simple manner (and also in a variety of manners).

Initially returning, once again, to act a), provision may be made, for example, for the frequency of the alternating magnetic field to be identical to a fixed frequency of the reference clock produced on the base unit-side. In particular, in the case of a reference clock frequency of, for example, 5 MHz, a rotating magnetic field with a rotational frequency of, accordingly, 5 MHz may therefore be produced. However, the phrase "alternating magnetic field, modulated in accordance with a reference clock," may also comprise deviating embodiments, in which the alternating field frequency deviates from the reference clock frequency (e.g., provided as an integer multiple or an integer fraction of the reference clock frequency). All that is essential is that the reference clock may be retrieved from the alternating magnetic field in act b), for example, by a demodulation fitting to the modulation undertaken in act a).

The alternating field frequency employed in act a) may be less than 50 MHz, and, in certain embodiments, less than 20 MHz. A comparatively low alternating field frequency (e.g., rotating frequency), advantageously leads to the field in the MRI recording space being able to be formed in a substantially homogeneous manner, even if a body is situated in the recording space.

The use of a rotating magnetic field in act a) is advantageous in that the specific orientation of the reception coil for receiving the energy to be transmitted (for the electric supply of the local electronics) has a less strong effect on the efficiency of the energy transmission. In respect of the alternating field design, the measure also advantageously contributes to being able to arrange the local coil unit as desired without relatively large power losses.

If the frequency of the alternating field corresponds to the reference clock frequency produced on the base unit-side, the retrieval of the reference clock on the local side may be achieved in a generally simple fashion in terms of circuitry.

Retrieval of the reference clock also applies if the magnetic field frequency is an integer multiple (or an integer fraction) of the reference clock frequency. In one embodiment, merely corresponding frequency splitting (or frequency multiplication) is to be provided on the reception side.

In respect of obtaining energy in act b), obtaining energy may be brought about with simple circuitry, for example by using a rectification of an AC voltage induced on the reception side in a reception coil or the like. The rectified voltage may be used for charging a local-side energy store (capacitor or the like).

In certain embodiments, the reference clock retrieved in act b) is employed for the local-side production of one or more further clock signals, for example for producing clock signals for all circuitry parts of the local coil electronics that are operated in a clocked manner. In particular, a plurality of different local clocks may be produced thereby for one or more of the following circuitry parts: (1) analog/digital converter, for example, for A/D conversion of MRI reception signals into digital MRI data that may be used as the MRI information in act c); (2) digital logic circuits, for example, for digital signal processing of MRI data; (3) phase control loops; and (4) local oscillators for analog components such as, for example, a frequency mixer.

The use of the reference clock retrieved on the local side for producing one or more local clock signals may be implemented as frequency multiplication or frequency splitting, optionally also using frequency mixing (upward or downward).

As already mentioned, the return transmission of the reference clock by a radio signal undertaken with act c) may, where possible, not induce additional phase errors. To this end, the corresponding clock information must be "packaged" into the radio signal in a suitable manner. In one embodiment, a carrier signal derived from the clock signal retrieved on the local side, onto which carrier signal the MRI information is modulated, is used to produce the radio signal. Modulation of analog MRI reception signals thereon is feasible, but modulation of digital MRI data already formed on the local side from the analog MRI reception signals is also feasible.

Such a carrier frequency for the data transmission may be greater than 100 MHz, and, in some embodiments, greater than 500 MHz or even greater than 1 GHz, in order to provide a correspondingly high signal bandwidth. Moreover, comparatively small antennas may advantageously be used at such high frequencies, or else it is also possible to use a plurality of relatively small antennas, for example, for improving the reception.

If the production of the carrier frequency is based on the clock signal retrieved in act b) (e.g., by frequency multiplication), the radio signal carrier may also contain the phase modulation that, per se, may be undesirable. Since the phase error by a distance change of the type mentioned above is proportional to the frequency, the phase error of the radio carrier signal would therefore be substantially greater at the aforementioned relatively high frequencies (e.g., 2 GHz) (compared to the phase error, for example, in a 5 MHz alternating field during the outward-transmission).

The use of an analog phase-varying modulation type (such as, e.g., PM), would therefore be extremely inexpedient for the return transmission channel.

In one embodiment, the MRI information is modulated onto the carrier signal of the radio signal in act c) by an amplitude modulating method, whether the MRI information is within the scope of an analog or digital modulation type. Examples for such modulation methods include AM (amplitude modulation), ASK (amplitude-shift keying), and, in particular, e.g., OOK (on-off keying). Other methods, which are not dependent on the carrier phase, may also be advantageously used.

In one embodiment, a digital modulation type is used in act c). Thus, for example, a digital transmission of the MRI data as a symbol stream with any modulation method may take place in act c), during the simultaneous measurement of the phase on the reference clock by retrieving the symbol clock in act d) from the modulated data stream.

In the case of a digital modulation type, the use of, in particular, a phase-varying modulation type (e.g., phase-shift keying (PSK) or quadrature amplitude modulation (QAM)), is not problematic either since many reconstruction methods are known for the phase of such modulation types (e.g., an equalizer that estimates and corrects the phase as part of the channel pulse response). Since the phase or phase error information, desired for the image reconstruction, is already available in the data stream in digitized form, the data stream is also no longer influenced thereby, as long as an approximate association between data symbol and time of emission is possible.

A symbol clock retrieval suitable is known as such from the prior art of digital transmission methods and is generally already implemented in any case in a digital receiver, simplifying such a digital solution even more. Accordingly, in very general terms, the MRI information may be modulated in the form of digital data onto a carrier signal of the radio signal produced on the local side, for example, using one of the aforementioned modulation methods.

When using the clock signal retrieved in act b) as a basis for a radio carrier signal to be used in act c), the effects caused by the movements of the local coil unit that occur in the same direction both in the outward channel (act b) and in the return channel (act c), generally may not be measured. By way of example, the effects caused by distance change of the local coil unit may not be measured where antennas for the rotating field to be transmitted in act a), and antennas for the data return transmission path have the same arrangement. In relation to the numerical example explained above, the run-time change caused by the change in distance would occur in both channels for one embodiment, and so the aforementioned 1.46° phase error at the Larmor frequency would remain uncorrected. However, an error with a rather small order of magnitude may often be ignored in practice.

However, in accordance with one development, a further reduction of a "residual error" may alternatively be obtained by virtue of the fact that, for example, use is not made on part of the MRI base unit of one reception antenna but of a plurality of receivers arranged at a distance from one another on the MRI base unit for the return transmission in accordance with acts c) and d). The radio signal transmitted to the MRI base unit in act c) is therefore received a number of times, wherein, however, a phase change caused by movement of the local coil unit having a different effect for the different reception paths. Hence, a phase difference between the individual received signals may be registered in act d) when processing the radio signal received a number of times and the phase difference may be used for a corresponding determination (and, for example, for a corresponding correction) of the phase shift on the return transmission path.

For example, if two diametrically opposed reception antennas are provided on the MRI base unit, a movement of the local coil unit or transmission antenna occurring along the connecting line between the diametrically opposed reception antennas has an effect in the two reception paths with opposite sign. For example, the distance change is positive from the point of view of one of the reception antennas, whereas the distance change is negative from the point of view of the other reception antenna. From a mathematical point of view, the movement results in a system of two equations for run-time errors in the same and in opposite directions, as a result of which, ultimately, both run-time error components may be calculated.

However, the example above is rather more theoretical to the extent that, in practice, there may not be only a single movement or rotation direction for the uncontrollable movements of the local coil unit, but such movements (translational and/or rotational) may occur along all three spatial directions or spatial axes. However, in accordance with the above-described development (e.g., by the use of a plurality of reception antennas), it is likewise possible to obtain improvements in such cases, for example by virtue of use being made of more than two (e.g., at least four or at least six), reception antennas in order to receive the radio signal transmitted to the MRI base unit in act c) at corresponding different positions and to supply suitable correction information to be taken into account in the subsequent image reconstruction by taking into account the phase error information that may accordingly be established in more detail therefrom. In particular, provisions may be made for a plurality of reception antenna pairs with individual antennas (e.g., coils), arranged diametrically opposite one another in respect of the MRI recording space.

In accordance with a further aspect, the technical problem posed at the outset is also achieved by a method for operating a MRI system, including a provision of MRI data in accordance with a method of the type described above, and an image reconstruction by an evaluation apparatus of an MRI base unit of the MRI system, in which the result of a comparison of the phases, firstly, of the reference clock used for the magnetic field modulation and, secondly, of the reference clock retrieved from the radio signal is also taken into account.

DETAILED DESCRIPTION

Figure 1:
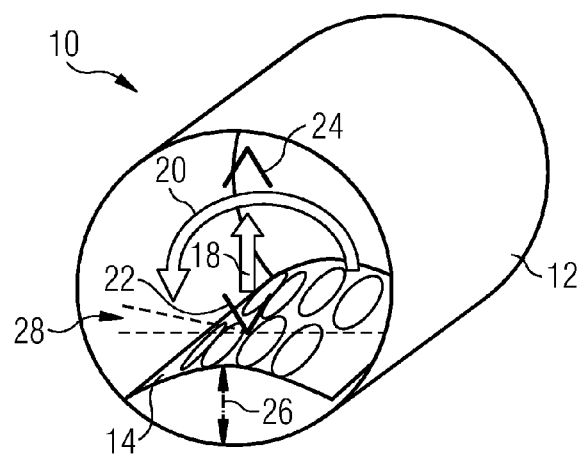
FIG. 1 depicts a simplified example representation of an MRI system for visualizing certain geometric conditions in a recording space of the system.

FIG. 1 schematically shows some components of an MRI system 10, including a MRI base unit 12 and an MRI local coil unit 14.

FIG. 1 symbolizes one "bore" (e.g., examination tube), of the base unit 12 that may also comprise components useful for MRI examinations for producing the MRI magnetic field (including excitation fields used for exciting nuclear spins) and an evaluation apparatus (cf. reference sign 16 in FIG. 2) serving to carry out the MRI image reconstruction. A recording space for a patient to be examined is formed in the interior of the examination tube, where the patient is carried into the recording space by, for example, a patient couch prior to the start of the examination. The methods for generating the MRI magnetic field are not depicted in FIG. 1.

The local coil unit 14, likewise plotted in FIG. 1 in a symbolized manner, is a unit arranged on the patient during the MRI examination, in which unit one or more so-called local coils with associated electronics (e.g., preamplifier), are housed. The nuclear spin responses (to preceding nuclear spin excitation) are measured by the local coils. In FIG. 1, some of the local coils ("loops") are depicted on the local coil unit 14 that overall has a mat-shaped design.

The MRI magnetic field production and the MRI image reconstruction as such will not be discussed in any more detail here. In certain embodiments, it is possible to resort to prior art relating to MRI.

In the following text, the type of a wireless link from the local coil unit 14 to the base unit 12 will be described in more detail.

In certain embodiments, an alternating magnetic field 18, modulated in accordance with a reference clock (e.g., with a frequency of 5 MHz), is advantageously produced by the base unit 12. In the described example, a constant magnitude magnetic field 18 rotates with the predetermined rotational frequency (e.g., likewise 5 MHz), about a longitudinal axis of the arrangement depicted in FIG. 1 (the rotational direction of the magnetic field 18 is symbolized by an arrow 20).

The magnetic field 18 is employed by the local coil unit 14 for obtaining electric energy and for retrieving the reference clock. As a result of the local coil, it is possible to provide the electric supply to all of the "local electronics" (e.g., the aforementioned preamplifiers, etc.), in a wireless fashion and, it is possible to provide a "5 MHz clock basis" on the local side from which advantageously a multiplicity of further clocks or clock frequencies, required on the local side, may be produced or derived.

By local electronics (not depicted in FIG. 1) of the local coil unit 14, a radio signal, originating in the illustrated example from a transmission antenna 22 of the local coil unit 14, is transmitted during the MRI examination, where the radio signal is received on the side of the base unit 12 by a reception antenna 24. The radio signal contains MRI information representing the MRI reception signals (e.g., a digital representation of the MRI reception signals), and clock information representing the retrieved reference clock.

The received radio signal is processed by the base unit 12 in such a way that the MRI data and the reference clock are retrieved therefrom. The MRI data and the retrieved reference clock are thereupon taken into account during the MRI image reconstruction using the evaluation apparatus 16 (FIG. 2).

The latter taking account of the retrieved reference clock enables a high-quality image reconstruction, even in the case where there is a phase change or a phase modulation of the reference clock, provided to the local electronics, in respect of the originally produced reference clock (at the base unit 12), due to uncontrollable movements of the local coil unit 14 (e.g., due to respiration of the patient).

In the example of FIG. 1, such a movement of the local unit 14 may comprise, e.g., in particular, a distance change, symbolized by the arrow 26, in the direction of a connecting line of the antennas 22 and 24 and/or a tilt or rotation about the rotational axis of the rotating magnetic field 18, symbolized at 28.

Figure 2:
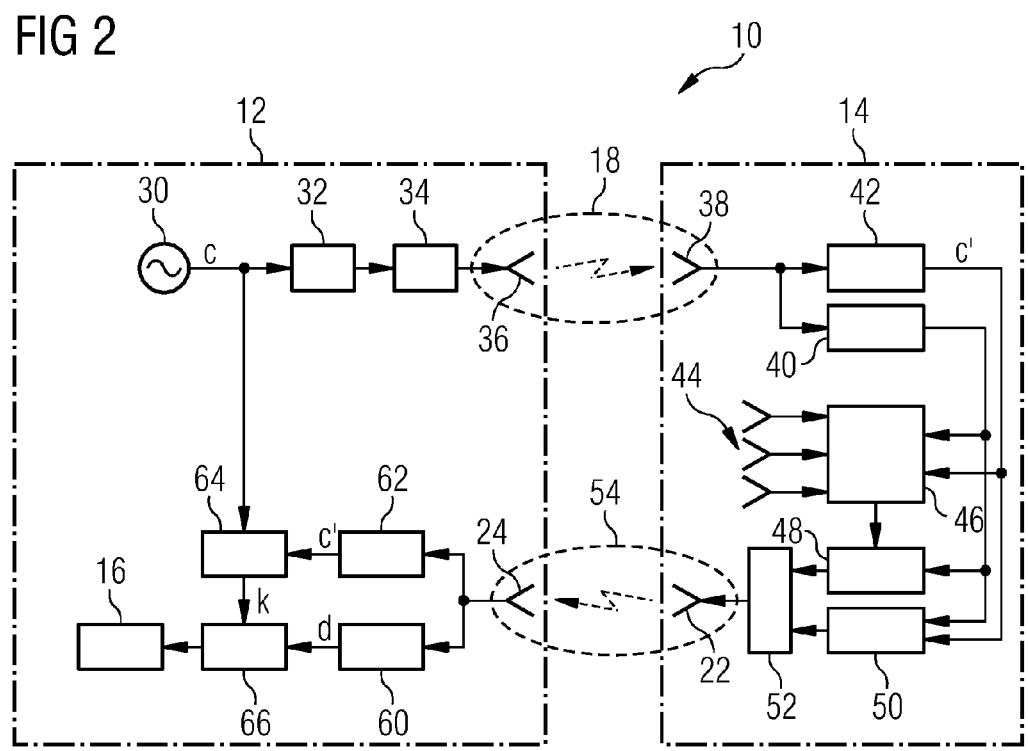
FIG. 2 depicts one embodiment of a block diagram of certain electronic components of the MRI system from FIG. 1.

In a block diagram, FIG. 2 shows an embodiment in terms of circuitry for the MRI system 10 in FIG. 1. As already is the case in FIG. 1, FIG. 2 substantially sketches out the system components required for the better understanding of the embodiments.

The base unit 12 and the local coil unit 14 of the MRI system 10, which operates as discussed below, are surrounded in each case by a dashed edge in FIG. 2.

In the base unit 12, provision is made for a clock generator 30 for generating a sinusoidal or rectangular reference clock signal, for example, abbreviated to "reference clock" c. The reference clock c serves firstly to clock the MRI magnetic field production, to be brought about by the base unit 12 within the scope of the MRI method to be employed, for aligning or exciting nuclear spins within the recording space (examination tube) of the system 10. The first use of the reference clock c has not been depicted in FIG. 2 for reasons of simplicity, but rather the transmission thereof to the local coil unit 14 has been depicted.

In certain embodiments, the base unit 12 comprises a clock modulator 32, an amplifier apparatus 34 and a magnetic field transmission apparatus 36. In the simplest case, e.g., a sinusoidal clock signal, c could simply be used in a suitably amplified form for feeding current to a magnetic coil (magnetic field transmission apparatus) in order to produce the desired, e.g., modulated in accordance with the reference clock, alternating magnetic field 18. However, as already mentioned previously, a magnetic field 18 rotating with the frequency of the reference clock c is produced in an exemplary embodiment. In some embodiments, the modulator 32 and the amplifier apparatus 34 may, for example, be embodied to generate the magnetic field 18 by a multiplicity of magnetic coil pairs (magnetic field transmission apparatus 36), where each magnetic coil pair is formed by two individual coils arranged diametrically opposite to one another in respect of the recording space and fed with current in a temporal sequence in such a way that the rotating field 18 with the desired rotational frequency (identical to the frequency of the reference clock c in the simplest case) is produced.

The local coil unit 14 comprises a magnetic field reception apparatus 38, that is to say, for example, a magnetic coil, in which an alternating current is induced at a point in accordance with the time variation of the magnetic field 18.

As symbolized in FIG. 2, an alternating current is fed, firstly, to an energy obtaining apparatus 40 for retrieving energy from the rotating field 18 and, secondly, to a clock demodulator 42 for retrieving the reference clock c from the rotating field 18. If the rotational frequency of the magnetic field 18 as such represents the reference clock c, the clock demodulation may be formed in a very simple manner, e.g., merely as a level adaptation and/or conversion into a rectangular signal. Depending on the modulation by the clock modulator 32, employed on the base unit-side, the clock demodulator 42 may however also involve, for example, a frequency multiplication or frequency splitting. The clock demodulator 42 may also include those circuitry parts that serve the generation of even more reference clocks that are required by the "local electronics," e.g., the totality of the electronic circuit components of the local coil unit 14.

Obtaining energy by the apparatus 40 involves, for example, a rectification of the supplied induction voltage (and, in certain embodiments, smoothing and intermediate storage of the electric energy).

As depicted, the electric energy retrieved by the apparatus 40 and the reference clock c' retrieved by the clock demodulator 42 are fed to further components of the local electronics. If the clock demodulator 42 requires a power supply, the power supply may also be provided by the energy obtaining apparatus 40. The reference sign c' for the retrieved reference clock, in contrast to the reference sign c for the reference clock c produced originally (by the clock generator 30), may express that the retrieved reference clock c' has a phase modulation, undesired per se, due to movements of the local coil unit 14 in respect of the base unit 12 that may not be entirely avoided in practice. For example, reference clock c' may express that the reference clock c' is not completely identical to the original reference clock c.

In a manner known per se, the local coil unit 14 furthermore comprises an arrangement 44 of so-called local coils, by which the MRI reception signals arising on the local side during the MRI examination or the individual "MRI experiments" are registered. Proceeding from the local coil arrangement 44, the analog reception signals (induced voltages) are fed to a reception apparatus 46 for further processing (e.g., amplifying).

In known MRI systems, the appropriately processed (e.g., amplified), signals output by the reception apparatus for the MRI reception signals (nuclear spin responses) are transmitted to the MRI base unit 12 by wires.

In the depicted MRI system 10, the output signals (e.g., analog signals or a stream of digital data (symbol stream)), are fed to a data modulator 48 in order thereby to (a) produce a radio signal 54 containing MRI information representing the MRI reception signals and clock information representing the retrieved reference clock c', and (b) transmit the radio signal by (at least) one transmission antenna 22 to (at least) one reception antenna 24 on the base unit 12.

What is important here for the functionality of the system 10 is that the modulation of the radio signal is carried out in a manner such that clock information representing the reference clock c' is also inherent to the radio signal 54. In FIG. 2, the modulation is taken into account by an especially sketched out clock modulator 50 and a "combination" 52 (of data and clock) in the radio signal 54 to be transmitted.

Accordingly, the radio signal 54 received by the reception antenna 24 may be processed on part of the base unit 12 in such a way that the MRI reception signals or MRI information representing the radio signals and the reference clock c' may be extracted therefrom. In FIG. 2, a data demodulator 60 and a clock demodulator 62 are depicted.

The decisive advantage of the return transmission of the reference clock c' to the base unit 12 implemented thus consists of the fact that a comparison between the original reference clock c and the return transmitted reference clock c', which is afflicted by an uncontrollable phase error, allows appropriate taking account of the phase error or an appropriate correction functionality within the scope of the MRI image reconstruction.

Accordingly, provision is made in a method for operating the MRI system 10 for the result of a comparison of the phases, firstly, of the reference clock c used for the magnetic field modulation (by the modulator 32) and, secondly, of the reference clock c' retrieved from the radio signal 54 also to be taken into account in the image reconstruction.

In the example as per FIG. 2, the signals c and c' are entered into a phase comparison apparatus 64 in order to output a correction signal k that represents the phase difference between signals c and c' to a phase correction apparatus 66 that is arranged in the data transmission path (for MRI data d) between the output of the data demodulator 60 and an input of the evaluation apparatus 16. In one embodiment, the phase correction apparatus 66 brings about a corresponding correction of the data d on the basis of the likewise entered correction signal k, before the data d is transmitted on to the evaluation apparatus 16.

There are numerous possibilities in respect of the manner in which the information provided on the part of the MRI base unit in respect of the unwanted phase modulation of the reference clock is taken into account during the image reconstruction. In the following text, two variants will be explained with reference to FIGS. 3 and 4.

Figure 3:
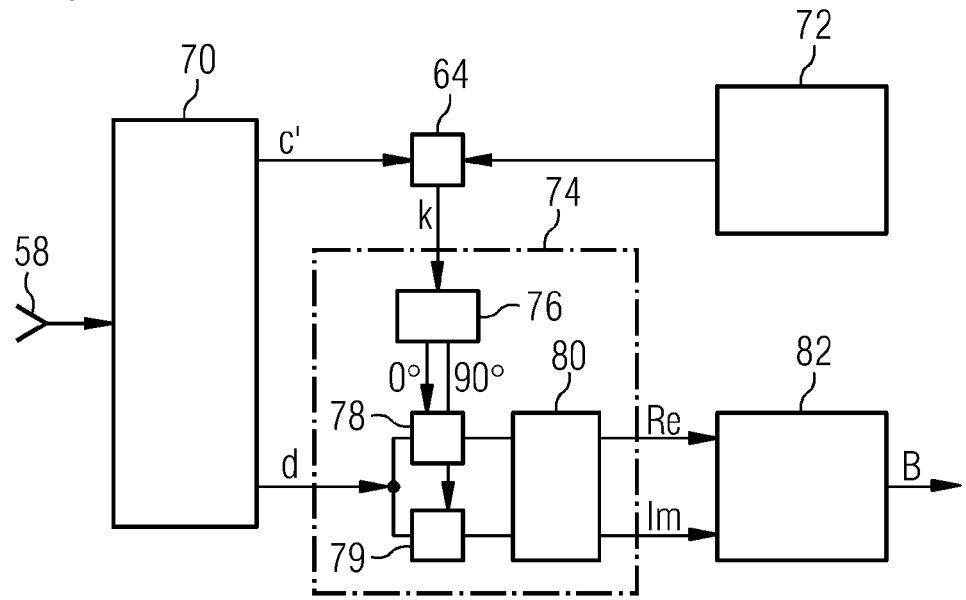
FIG. 3 depicts a block diagram for visualizing an embodiment for realizing a phase correction during the image reconstruction in an MRI system.

FIG. 3 shows an embodiment variant relating to the MRI image reconstruction taking into account not only the actual MRI data, but also the aforementioned clock information (containing information about the phase of the reference clock retrieved on the local side), as may be used in an operating method of an MRI system of the type described here (cf., for example, FIGS. 1 and 2).

The system components depicted in FIG. 3 in the form of a block diagram are situated on the base unit of the relevant MRI system.

It is once again possible to identify a reception antenna 24 with the function that has already described with reference to FIG. 2, e.g., for receiving a radio signal transmitted by the relevant local coil unit, which radio signal contains MRI information representing the MRI reception signals and clock information representing the retrieved reference clock.

The radio signal is fed to a radio receiver 70 for further processing via the reception antenna 24. The radio receiver 70 unifies the functionalities of the demodulators 60, 62, depicted separately in FIG. 2, for demodulating or providing, firstly, MRI data in the form of a digital data stream d and, secondly, the reference clock c'.

The reference clock c' having the phase error, which is undesirable per se, is compared by a phase comparison apparatus 64 to the original reference clock c provided by an MRI operating control unit 72, in certain embodiments, in such a way that a correction signal k representing the phase difference between the signals c' and c is output at an output of the phase comparison apparatus 64 and input at a control input of a controllable digital down converter 74.

The object of the digital down converter 74 is to mix down the high-frequency and highly sampled digital signal d into the relevant baseband and, in the depicted example, also to carry out a decimation (reduction in the sampling rate).

As known per se from the prior art, the down converter 74 comprises an oscillator 75 that, in an adaptation to the use, is embodied as a digitally controllable oscillator 75, and the output signal of which is entered firstly directly and secondly within 90° phase offset to in each case one of two mixers (multipliers) 78 and 79. Additionally, the intermediate frequency data signal d lying at a relatively high frequency is additionally entered into the mixers 78, 79, such that the data signal, mixed down at the mixer outputs, represented as a real part and imaginary part components, is entered at inputs of a decimator 80 that feeds the real part and imaginary part components Re and Im, reduced in terms of the sampling rate thereof, to the relevant evaluation apparatus, such as an MRI image computer 82. The conventional type of image computer 82 calculates/reconstructs the images B depicting the result of the MRI examination.

In certain embodiments, the phase error in the signal c' is taken into account by virtue of the fact that the oscillation frequency of the digitally controllable oscillator 75 is varied in accordance with the result of the phase comparison between the signals c' and c, for example, on the basis of the correction signal k. The MRI image computer 82 arranged downstream of the phase correction may therefore operate in a manner known per se.

Figure 4:
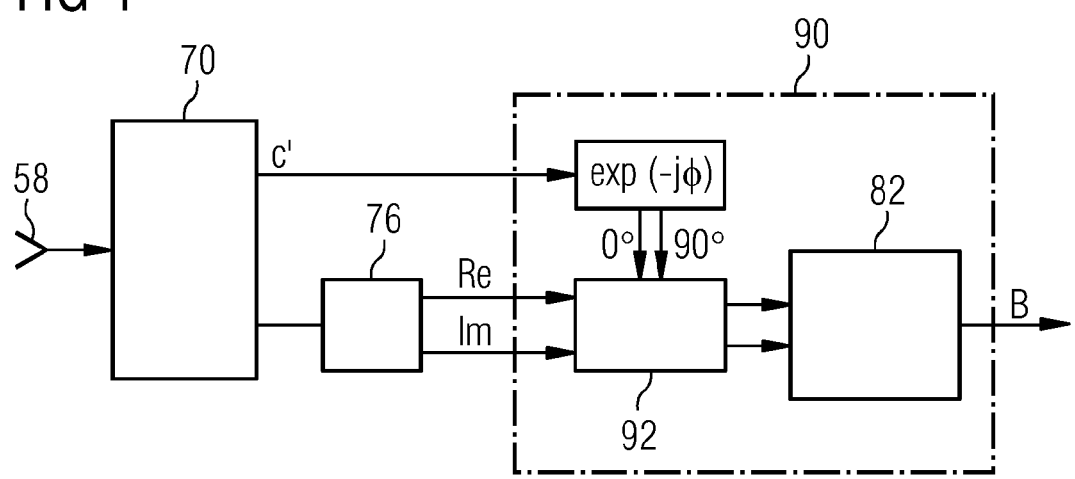
FIG. 4 depicts one embodiment of a block diagram for visualizing an alternative realization of such a phase correction.

FIG. 4 shows another embodiment variant relating to the image reconstruction also taking into account the phase error in the retrieved reference clock c'.

Like in the embodiment as per FIG. 3, the radio signal received by a reception antenna 24 is also fed to a radio receiver 70 that, in certain embodiments, once again outputs on the output side of the reference clock c' afflicted by a phase error and digital data d transferred to a relatively high intermediate frequency.

Likewise as in the embodiment in accordance with FIG. 3, the digital data signal d is fed to a digital down converter 76. However, in contrast to the down converter 74 used in FIG. 3, no phase correction has been implemented in the down converter 76 used in FIG. 4. Rather, the down converter 76 provides real part and imaginary part components Re and Im of the MRI data d in a still uncorrected manner at the input of an MRI image computer 90 (with a modified design).

For a correction functionality, the image computer 90 contains a complex multiplier 92 for carrying out a complex multiplication (of two complex data values). The one data value to be multiplied is represented by the real part Re and the imaginary part Im of the data signal d supplied by the down converter 76. The other data value is supplied by a phase correction unit 94, into which the reference clock c', which is afflicted by error, is entered in order to form a second multiplier.

The variants explained above with reference to FIGS. 3 and 4 represent specific solutions for the correction to be carried out within the scope of the image reconstruction due to the phase error. In the variant as per FIG. 3, the correction still occurs in the digital intermediate frequency data in the region of a data receiver, whereas, in the variant as per FIG. 4, the correction takes place as a complex multiplication only in the down-mixed (and optionally decimated) baseband data.

A likewise embodiment of the variant as per FIG. 3 would lie in directly manipulating not the frequency but the phase of the digitally controllable oscillator 75 in the down converter 74 depending on the registered phase error (signal c' or signal k).

A further variant consists of completing the required correction in the actual image computer by suitable modification of image reconstruction software running thereon. In order to supply the image computer with information about the time offset (phase error), it would be possible, for example, initially to digitize the regenerated reference clock c' by an A/D converter and for a reference clock then to be fed in digital form to an additional (e.g., low rate), input channel of the image computer.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for providing magnetic resonance imaging (MRI) data for an image reconstruction to be carried out by an evaluation apparatus on a MRI base unit of a MRI system, wherein the MRI data is formed by MRI reception signals obtained by a MRI local coil unit of the MRI system, the method comprising:

producing an alternating magnetic field by the MRI base unit, wherein the alternating magnetic field is modulated in accordance with a reference clock;

obtaining electric energy for supplying local electronics of the MRI local coil unit from the alternating magnetic field by the MRI local coil unit;

retrieving the reference clock from the alternating magnetic field by the local electronics, defining a retrieved reference clock;

producing a radio signal containing MRI information representing the MRI reception signals and clock information representing the retrieved reference clock by the local electronics and transmitted to the MRI base unit; and processing the radio signal by the MRI base unit, wherein the MRI data and the clock information are retrieved therefrom and provided to the evaluation apparatus for the image reconstruction.

2. The method as claimed in claim 1, wherein the alternating magnetic field is a rotating magnetic field.

3. The method as claimed in claim 2, wherein the MRI information in a form of digital MRI data is modulated onto a carrier signal of the radio signal produced on the MRI local coil unit.

4. The method as claimed in claim 2, wherein a carrier signal derived from a clock signal retrieved on the MRI local coil unit, onto which the carrier signal the MRI information is modulated, is used to produce the radio signal.

5. The method as claimed in claim 4, wherein the MRI information in a form of digital MRI data is modulated onto the carrier signal of the radio signal produced on the MRI local coil unit.

6. The method as claimed in claim 4, wherein the MRI information is modulated onto the carrier signal by amplitude modulation or amplitude-shift keying.

7. The method as claimed in claim 6, wherein the amplitude-shift keying is an on-off keying.

8. The method as claimed in claim 6, wherein the MRI information in a form of digital MRI data is modulated onto the carrier signal of the radio signal produced on the MRI local coil unit.

9. The method as claimed in claim 1, wherein a carrier signal derived from a clock signal retrieved on the MRI local coil unit, onto which the carrier signal the MRI information is modulated, is used to produce the radio signal.

10. The method as claimed in claim 9, wherein the MRI information is modulated onto the carrier signal by amplitude modulation or amplitude-shift keying.

11. The method as claimed in claim 10, wherein the MRI information in a form of digital MRI data is modulated onto the carrier signal of the radio signal produced on the MRI local coil unit.

12. The method as claimed in claim 9, wherein the MRI information in a form of digital MRI data is modulated onto the carrier signal of the radio signal produced on the MRI local coil unit.

13. The method as claimed in claim 1, wherein the MRI information in a form of digital MRI data is modulated onto a carrier signal of the radio signal produced on the MRI local coil unit.

14. A method for operating a magnetic resonance imaging (MRI) system having a MRI base unit and a MRI local coil, the method comprising:

producing an alternating magnetic field by the MRI base unit, wherein the alternating magnetic field is modulated in accordance with a reference clock;

obtaining electric energy for supplying local electronics of the MRI local coil from the alternating magnetic field by the MRI local coil;

retrieving the reference clock from the alternating magnetic field by the local electronics, defining a retrieved reference clock;

producing a radio signal containing MRI information representing MRI reception signals and clock information representing the retrieved reference clock by the local electronics and transmitted to the MRI base unit;

processing the radio signal by the MRI base unit, wherein the MRI data and the clock information are retrieved therefrom and provided to an evaluation apparatus for an image reconstruction; and carrying out the image reconstruction by the evaluation apparatus on the MRI base unit of the MRI system, wherein the image reconstruction comprises a comparison of phases between the reference clock and the retrieved reference clock.

15. The method as claimed in claim 14, wherein the alternating magnetic field is a rotating magnetic field.

16. The method as claimed in claim 14, wherein the MRI information in a form of digital MRI data is modulated onto a carrier signal of the radio signal produced on the MRI local coil.

17. The method as claimed in claim 14, wherein a carrier signal derived from a clock signal retrieved on the MRI local coil, onto which the carrier signal the MRI information is modulated, is used to produce the radio signal.

18. The method as claimed in claim 17, wherein the MRI information is modulated onto the carrier signal by amplitude modulation or amplitude-shift keying.

19. The method as claimed in claim 18, wherein the amplitude-shift keying is an on-off keying.

* * * * *